United States Patent [19]

Wojcicki et al.

[11] Patent Number: 5,642,068
[45] Date of Patent: Jun. 24, 1997

[54] CLOCK PERIOD DEPENDENT PULSE GENERATOR

[75] Inventors: Tomasz Wojcicki, Kanata; Graham Allan, Stittsville, both of Canada

[73] Assignee: Mosaid Technologies Incorporated, Kanata, Canada

[21] Appl. No.: 650,814

[22] Filed: May 20, 1996

Related U.S. Application Data

[63] Continuation of Ser. No. 287,271, Aug. 8, 1994, abandoned.

[51] Int. Cl.$^6$ ............................................. H03K 3/017
[52] U.S. Cl. ........................ 327/172; 327/176; 327/291; 327/294
[58] Field of Search ..................... 327/170, 172–176, 327/145, 149, 261, 291, 294; 326/93, 96; 331/57

[56] References Cited

U.S. PATENT DOCUMENTS

| | | | |
|---|---|---|---|
| 3,694,758 | 9/1972 | Dyer | 327/295 |
| 3,735,270 | 5/1973 | Holub | 327/286 |
| 4,227,251 | 10/1980 | Kazama et al. | 375/360 |
| 4,623,845 | 11/1986 | Ide | 327/160 |
| 4,638,256 | 1/1987 | Hong et al. | 327/297 |
| 4,695,873 | 9/1987 | Smith | 348/496 |
| 4,734,597 | 3/1988 | Ullrich et al. | 326/98 |
| 4,961,013 | 10/1990 | Obermeyer, Jr. et al. | 327/291 |
| 5,072,132 | 12/1991 | Samaras | 327/202 |
| 5,128,624 | 7/1992 | Hoshino et al. | 327/3 |
| 5,138,188 | 8/1992 | Bazes | 327/172 |
| 5,173,618 | 12/1992 | Eisenstadt | 327/239 |

Primary Examiner—Timothy P. Callahan
Assistant Examiner—Kenneth B. Wells
Attorney, Agent, or Firm—Pascal & Associates

[57] ABSTRACT

A variable pulse width generator comprised of apparatus for receiving a clock signal, apparatus for terminating an output pulse from a leading edge of the clock signal, and apparatus for initiating another output pulse following the terminated output pulse from the leading edge of the clock signal and after a first delay, whereby successive output pulses are initiated and terminated that are related to the leading edge of the clock signal, and thus are related to the frequency but not the pulse Width of the clock signal.

8 Claims, 1 Drawing Sheet

CLOCK PERIOD DEPENDENT PULSE GENERATOR

This is a continuation of application Ser. No. 08/287,271, filed Aug. 8, 1994, now abandoned.

FIELD OF THE INVENTION

This invention relates to a pulse generator, which may usefully be employed in a dynamic random access memory (DRAM) such as a synchronous dynamic random access memory.

BACKGROUND TO THE INVENTION

Synchronous DRAMs require a column access pulse which is internally timed in order to connect the DRAM sense amplifiers to a databus of the DRAM. Typically a simple pulse generator with an internal delay which defines the pulse width has been used for this purpose.

To operate a DRAM at very fast speeds, such as at 100 MHz, pulses generated by the pulse generator must be extremely short. Some DRAM chips are manufactured which do not meet the required speed specification, but can operate satisfactorily at slower speeds, such as at 80 MHz. In the past, such chips would be rejected since they could not operate from the very short pulses resulting from the clock generator, thus reducing yield.

SUMMARY OF THE INVENTION

The present invention is a pulse generator which provides variable width pulses, the pulse width varying with the clock frequency. The invention provides output pulses which have leading edges generated from the leading edges of a clock signal, and have pulse lengths that depend on the time to the next leading edge of the clock signal, rather than having a fixed interval.

As a result slower DRAMs can be operated from a slower clock (e.g. 80 MHz), and instead of the pulse generator having an inherent pulse interval that corresponds to the 100 MHz requirements that would have been the case previously due to the original pulse generator design, with the slower clock a longer pulse is generated in the pulse generator, facilitating more reliable operation of the slower DRAM, and allowing it to be salvaged for slower applications than required for the 100 MHz DRAMs. The yield of usable product is thus increased.

In accordance with an embodiment of the invention, a variable pulse width generator is comprised of apparatus for receiving a clock signal, apparatus for terminating an output pulse from a leading edge of the clock signal, and apparatus for initiating another output pulse following the terminated output pulse, from the leading edge of the clock signal and after a first delay, whereby successive output pulses are initiated and terminated that are related to the leading edge of the clock signal, and thus are related to the frequency but not the pulse width of the clock signal.

BRIEF DESCRIPTION OF THE DRAWINGS

A better understanding of the invention will be obtained by reading the description of the invention below, with reference to the following drawings, in which.

DETAILED DESCRIPTION OF THE PREFERRED EMBODIMENT

A clock signal (see CLK in FIG. 2) is applied to a CLK input 1, and is applied to one input of a NAND gate 3. The output of the NAND gate 3 is in communication with the reset (CLR) input of a flip flop 5 (ignoring for the moment the elements connected between the output of gate 3 and the reset input of flip flop 5).

Figure 2:
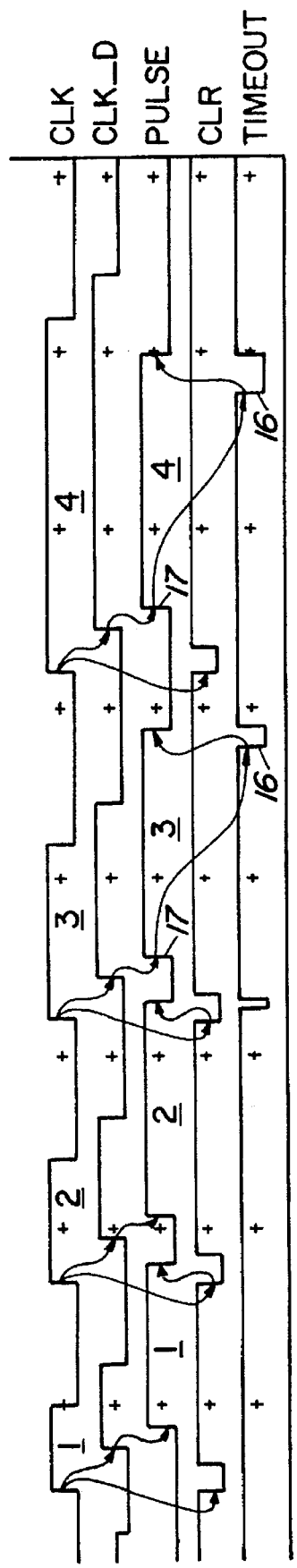
FIG. 2 is a signal timing chart illustrating signals which may be detected at various points in the embodiment described with reference to FIG. 1.

As a result of a high logic level leading edge of the clock signal being applied to the gate 3, the output of gate 3 goes to low logic level (see CLR, in FIG. 2). This signal resets the flip flop if it was already set by the rising edge of a previous clock pulse, which occurs following the inherent reset interval of the flip flop.

The clock signal also passes through a delay circuit which is set to be equal to or longer than the inherent reset interval of the flip flop, resulting in the delayed clock signal (CLK_D). This CLK_D signal is applied to the CLK input of flip flop 5. The flip flop is thereby set by the leading edge of the CLK_D signal with a delay from that leading edge which is equal to or longer than the inherent reset interval of the flip flop.

Figure 1:
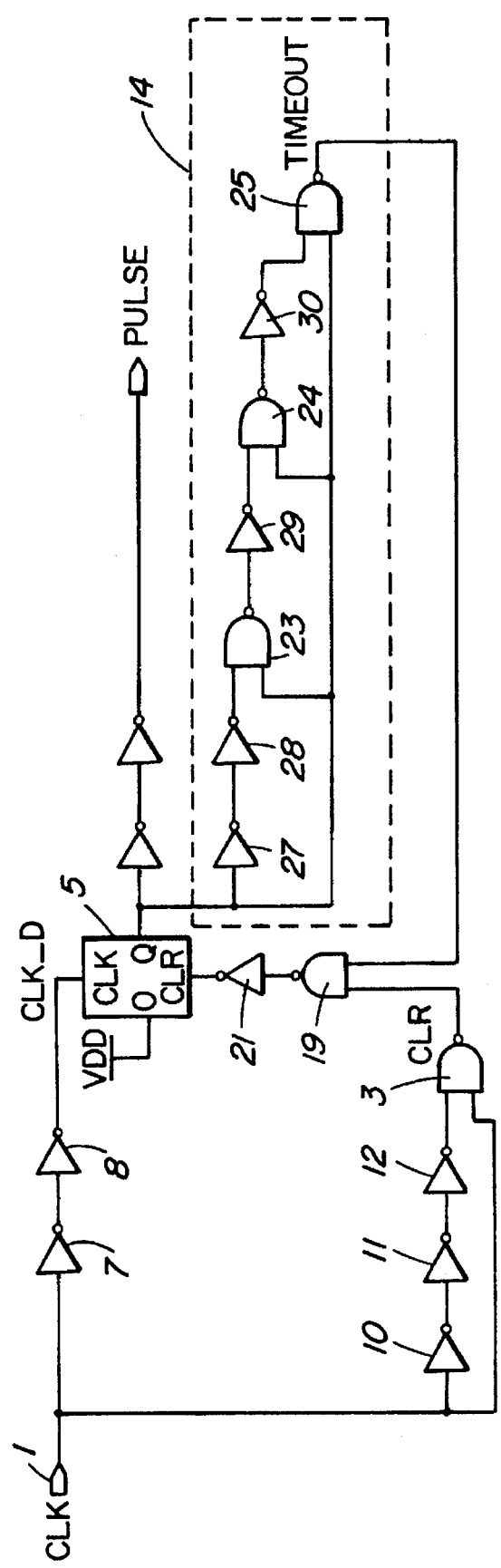
FIG. 1 is a schematic diagram of a preferred embodiment of the invention.

The delay circuit is realized in the embodiment illustrated in FIG. 1 by a series of two inverters 7 and 8, although more than two could be used, depending on the inherent reset interval of the flip flop.

The clock signal CLK is also applied through another delay circuit to a second input of NAND gate 3, the latter delay circuit being realized by a series of three inverters 10, 11 and 12. The leading edge of the clock signal thus applied directly to one input of gate 3 causes its output CLR* to go to low logic level, followed by its application to the gate 3 via inverters 10, 11 and 12 causing its output to recover to high logic level (see CLR* in FIG. 2).

In the above circuit, therefore, the leading edge of the clock signal causes resetting of the flip flop, which brings the output PULSE signal to go low logic level, if it is not already at low logic level, and after a delay caused by the delay circuit comprising inverters 7 and 8, to set the flip flop, causing the output PULSE signal to go to high logic level. The clock signal going to low logic level does not set or reset flip flop 5 since it is changing in the wrong polarity direction.

The next leading edge of the clock signal causes reset of the flip flop followed by setting of the flip flop, as noted above. Thus it may be seen that the timing of the output pulse is controlled by the period of the clock pulse, and not by its high or low logic pulse width. As the frequency of the clock pulse increases or decreases, the pulse width of the output signal decreases or increases accordingly, realizing an objective of the present invention.

The situation can occur in which the clock period exceeds the maximum required pulse width. In this case in another embodiment the flip flop is reset not by the next rising edge of the clock signal, but by a timeout signal.

Preferably the timeout signal is generated from the leading edge of the pulse output signal. The timout signal passes through a delay circuit 14. As shown in FIG. 2, a TIMEOUT signal having a leading edge 16 which is a predetermined time interval following the trailing edge 17 of the PULSE output signal. That predetermined time interval is the aforenoted maximum required pulse width less the reset time of the flip flop.

The timeout signal is applied to one input of a NAND gate 19, the output of NAND gate 3 being applied to the other input of NAND gate 19. The output of NAND gate 19 is connected to the input of inverter 21, and the output of inverter 21 is connected to the reset input of flip flop 5.

Thus it may be seen that the leading edge of the PULSE output signal is passed through the delay circuit 14 and is applied through NAND gate 19 to the reset input of flip flop 5, which is thereby reset, resulting in the trailing edge of the PULSE output signal. The following leading edge of the clock pulse also passes through NAND gate 3 as described earlier, and through NAND gate 19 to the reset input of flip flop 5, but since the flip flop has already been reset, it has no effect. However that delayed leading edge applied to the CLK input of flip flop 5 causes the flip flop 5 to be set, as described earlier, resulting in generation of a leading edge of the PULSE output signal.

It should be noted that the timeout signal can be obtained from external circuitry, or can be a signal obtained directly from the PULSE output signal via a time delay circuit.

A time delay circuit 14 can be realized by NAND gates 23, 24 and 25, each having one input connected to the data output of flip flop 5. The output of NAND gate 25 is connected to one input of NAND gate 19. The data output of flip flop 5 is connected to the second input of NAND gate 23 through a series of two inverters 27 and 28, the output of NAND gate 23 is connected to the second input of NAND gate 24 through inverter 29, and the output of NAND gate 24 is connected to the second input of NAND gate 25 through inverter 30.

Each of the series of inverters 27, 28, 29 and 30 delays the output pulse before it is applied from the output of NAND gate 25 to an input of gate 19, creating the aforenoted timeout delay. The correct polarity of the leading edge of the delayed output pulse is established by passing through those inverters, and gates 23, 24 and 25 whereby it drops to low logic level, similar to the CLR* signal, at the input of gate 19, so as to reset flip flop 5. However that same leading edge, applied directly to an input of the gate 25, is reversed in polarity at its output and has no reset effect on flip flop 5. However, the trailing edge of the PULSE output signal does change the polarity of the TIMEOUT signal at the output of gate 25, as may be seen in FIG. 2.

A person understanding this invention may now conceive of alternative structures and embodiments or variations of the above. All of those which fall within the scope of the claims appended hereto are considered to be part of the present invention.

We claim:

1. A variable pulse width generator comprising:
   (a) means for receiving a clock signal at a single port,
   (b) means for terminating an output pulse upon receipt of a leading edge of the clock signal,
   (c) means for initiating another output pulse following the terminated output pulse upon receipt of a next leading edge of the clock signal and after a first delay,
   whereby successive output pulses are each initiated and subsequently terminated from successive leading edges of the clock signal, and thus are dependent on the frequency but not the pulse width of the clock signal,
   (d) a flip flop, and in which the terminating means comprises means for applying a signal corresponding to the leading edge of the clock signal to a reset input of the flip flop,
   (e) the initiating means comprising means for applying the leading edge of the clock signal through a delay means to a clock input of the flip flop,
   (f) means for providing the output pulses from an output of the flip flop, and
   (g) the delay means having an inherent transmission delay which is longer than a time between the leading edge and reset of the flip flop as a result of the leading edge being applied to the reset input of the flip flop.

2. A generator as defined in claim 1 in which the delay means comprises at least a pair of series connected inverters.

3. A generator as defined in claim 1 including a timeout means for generating an output pulse after a delay which is shorter than a clock pulse period, the timeout means comprising means for receiving the output pulse, for delaying it a predetermined period and for applying a delayed representation of said leading edge to the reset input of the flip flop.

4. A generator as defined in claim 3 including a NAND gate for receiving said delayed output pulse at one input and said leading edge of the clock signal at another input and having an output in communication with the reset input of the flip flop.

5. A variable pulse width generator comprising:
   (a) means for receiving a clock signal at a single port,
   (b) means for terminating an output pulse upon receipt of a leading edge of the clock signal,
   (c) means for initiating another output pulse following the terminated output pulse upon receipt of a next leading edge of the clock signal and after a first delay,
   whereby successive output pulses are each initiated and subsequently terminated from successive leading edges of the clock signal, and thus are dependent on the frequency but not the pulse width of the clock signal,
   (d) timeout means for terminating said another output pulse after a delay which is shorter than a clock signal pulse period, the timeout means including means for starting a timing period from a leading edge of said another output pulse and further means for terminating the output pulse upon completion of the timing period.

6. A variable pulse width generator comprising:
   (a) a flip flop having flip flop clock input, a reset input, a data input and a data output, and means for connecting the data input to a fixed voltage source,
   (b) a single clock input for receiving a clock signal,
   (c) a pair of series connected inverters connected between the clock input and the flip flop clock input,
   (d) a first NAND gate having an output in communication with the reset input of the flip flop, one input of the first NAND gate being connected to the clock input, three series connected inverters being connected between the clock input and another input of the first NAND gate, and
   (e) output means connected to the data output of the flip flop for receiving output pulses from the flip flop.

7. A generator as defined in claim 6, further including:
   a second NAND gate having an input connected to the output of the first NAND gate and an output connected to the input of a sixth inverter, the output of the sixth inverter being connected to the reset input of the flip flop, and
   means for applying a timeout signal to another input of the second NAND gate.

8. A generator as defined in claim 7 in which the means for applying a timeout signal comprises third, fourth and fifth NAND gates, one input of each of the third, fourth and fifth NAND gates being connected together and to the data output of the flip flop, the output of the fifth NAND gate being connected to said another input of the second NAND gate, seventh and eighth series connected inverters being connected between said data output and another input of the third NAND gate, a ninth inverter being connected between the output of the third NAND gate and another input of the fourth NAND gate, and a tenth inverter being connected between the output of the NAND gate and another input of the fifth NAND gate.

* * * * *